United States Patent
Pyo

(10) Patent No.: US 6,349,887 B1
(45) Date of Patent: Feb. 26, 2002

(54) LIQUID DELIVERY SYSTEM

(75) Inventor: Sung Gyu Pyo, Kyungki-Do (KR)

(73) Assignee: Hyundai Electronics Industries Co., Ltd., Kyungki-Do (KR)

(*) Notice: Subject to any disclaimer, the term of this patent is extended or adjusted under 35 U.S.C. 154(b) by 0 days.

(21) Appl. No.: 09/428,049

(22) Filed: Oct. 27, 1999

(30) Foreign Application Priority Data

Dec. 30, 1998 (KR) .......................... 98-61355

(51) Int. Cl.$^7$ ................................. B05B 1/24
(52) U.S. Cl. ................. 239/137; 239/139; 239/226; 239/290; 239/397.5; 239/424
(58) Field of Search ............. 239/133, 134, 239/135, 136, 137, 139, 290, 226, 397.5, 424

(56) References Cited

U.S. PATENT DOCUMENTS

| | | | |
|---|---|---|---|
| 2,644,717 A | * 7/1953 | Kopperschmidt | |
| 3,577,165 A | * 5/1971 | Heliwell | |
| 4,065,057 A | * 12/1977 | Durmann | 239/133 |
| 4,349,723 A | * 9/1982 | Swiatosz | 239/139 |
| 4,669,661 A | * 6/1987 | Otto | 239/139 |
| 5,173,155 A | * 12/1992 | Miyata et al. | 202/205 |
| 5,230,162 A | * 7/1993 | Oyler, Jr. | 34/5 |
| 5,372,754 A | * 12/1994 | Ono | 239/137 |
| 5,849,089 A | * 12/1998 | Tsunnashima et al. | 118/726 |
| 5,882,416 A | 3/1999 | Van Buskirk et al. | |

FOREIGN PATENT DOCUMENTS

| EP | 2 275 877 A | 9/1994 |
|---|---|---|
| EP | 0 905 276 A2 | 3/1999 |

* cited by examiner

Primary Examiner—Lesley D. Morris
Assistant Examiner—Christopher S. Kim
(74) Attorney, Agent, or Firm—Penie & Edmonds LLP

(57) ABSTRACT

There is a disclosed a liquid delivery system (LDS) used upon deposition of a copper wire through chemical vapor deposition method in the process of manufacturing a semiconductor device. The LDS comprises a copper liquid materials supply [means] apparatus for providing copper liquid materials of a room temperature to a vaporizer [means] via an orifice which is rotating at a constant speed; a carrier gas supply [means] apparatus for jetting a carrier gas kept to the temperature at which copper will be vaporized via jet nozzles and forming the copper liquid materials to be supplied to said vaporizer [means] via said orifice with micro drops; and a jet [means] device for jetting vaporized copper stream to a reactive chamber, wherein said micro drops being vaporized in the vaporizer [means]. According to the present invention, it can solve the problems such as clogging of a vaporizer, a low reproduction and a low deposition speed, which are problematic in the conventional bubbler and direct liquid injection (DLI) apparatuses.

12 Claims, 2 Drawing Sheets

LIQUID DELIVERY SYSTEM

BACKGROUND OF THE INVENTION

1. Field of the Invention

The invention relates generally to a liquid delivery system (LDS). More particularly, it relates to a liquid delivery system capable of not only improving the deposition speed of copper but also implementing a high reproduction, when forming a copper wire using chemical vapor deposition method during the process of manufacturing a semiconductor device.

2. Description of the Prior Art

Generally, as the degree of integration and performance of a semiconductor device becomes higher, copper metal wire has been widely used as a metal wire in a semiconductor device. In the copper metal wire, the metal layer is deposited through physical vapor deposition (PVD) method, metal-organic chemical vapor deposition (MOCVD) method, electrical plating method etc. A conventional liquid delivery apparatus used to deposit copper through chemical vapor deposition method may include bubbler and direct liquid injection (DLI) apparatus.

As can be seen from FIG. 1, a conventional bubbler 10 comprises an inlet line 11, a canister 12 and an outlet line 14. A carrier gas is introduced via the inlet line 11. The introduced gas is mixed at a given ratio with metal liquid materials 13 contained in the canister 12 of the bubbler 10. The mixed gas then exits the canister 12 via the outlet line 14. The mixing ratio of the carrier gas with the metal liquid materials depends on the mass flow of the carrier gas, the temperature of the bubbler 10 and the pressure of the bubbler 10. This conventional type of bubbler 10 is not suitable for liquid materials such as copper liquid materials having a very low steam pressure. More particularly, it is required that the temperature of the bubbler 10 is kept constant. This makes the copper liquid materials likely to decompose, so that particles are generated. Accordingly, the conventional bubbler 10 has problems that it not only adversely affects the deposition film but also degrades reproduction and has a very low deposition speed.

FIG. 2 is a schematic view of a direct liquid injection (DLI) apparatus 230 currently used for deposition of copper through a metal-organic chemical vapor deposition method.

The DLI apparatus 230 principally comprises a micropump 20 and a vaporizer 30. The DLI apparatus pressurizes metal liquid materials from the ampule 19 at a pressure of about 20 psi and then passes them to the micropump 20 via the first valve 21. As the first piston 23 is raised by the first stepping motor 22, the metal liquid materials fill the first cylinder 24. Then the first valve 21 is closed and the second valve 25 is opened. Next, the first piston 23 is lowered while the second piston 27 is raised by the second stepping motor 26, causing the metal liquid materials filled in the first cylinder 24 [will] to flow into the second cylinder 28 via the second valve 25. When the second cylinder 28 is completely filled with the metal liquid materials, the second valve 25 is closed and the third valve 29 is opened. Next, the second piston 27 is lowered, causing the metal liquid materials to be transferred to the vaporizer 30 via the third valve 29. At this point, the first valve 21 is once again opened and the first piston 23 rises, causing the first cylinder 24 to again be filled with the metal liquid materials. As these processes are repeated, the metal liquid materials will be provided from the micropump 20 to the vaporizer 30. The control of the mass flow is determined by the cycle number of the stepping motors 22 and 26.

The metal liquid materials supplied from the micropump 20 will flow into 99 metal disks 32 via the delivery valve 31, and will be vaporized by heating zones 33 in the metal disks 32 and will then exit the vaporizer 30 along with the carrier gas.

The driving of the metal disks 32 in the vaporizer 30 depends on the metal liquid materials introduced therein. Furthermore, the micropump 20 and vaporizer 30 are arranged such that micropump can cause the formation of pressure in the vaporizer. Accordingly, it is extremely difficult to keep constant the pressure of the metal liquid materials and it takes a lot of time (several tens minutes) for the pressure of the metal liquid materials to attain an equilibrium state. In addition, at an initial state, if suction of the metal liquid materials occurs, a lot of metal liquid materials will be introduced into the metal disks 32. Thus, vaporization of the metal liquid materials is difficult and some of them will remain unvaporized, thereby clogging the vaporizer 30.

Accordingly, materials such as copper liquid materials have problems in that they are difficult to deposit uniformly on a wafer due to a very low vapor pressure and also because they decompose easily. And when they decompose in the metal disks, they are likely to cause clogging. Also, there is a problem in that they will degrade reproduction and thus will be impossible to apply for a mass production in the process of manufacturing a semiconductor device due to extremely short consecutive deposition periods.

SUMMARY OF THE INVENTION

It is therefore an object of the present invention to provide a liquid delivery system capable of not only improving the deposition speed of copper but also implementing reproduction thereof, when depositing a copper layer using copper liquid materials by means of a metal organic chemical vapor deposition method during the process of manufacturing a semiconductor device.

In order to accomplish the above object, the liquid delivery system (LDS) according to the present invention is characterized in that it comprises a vaporizer including:
   a vaporizing chamber which has a second heating jacket provided at a side wall of said vaporizing chamber for vaporizing ultra-micro liquid drops of a copper liquid materials,
   a heater provided at a bottom of said vaporizing chamber for vaporizing any ultra-micro liquid drops which were not vaporized, and
   a pressure measuring apparatus, and a pressure pump having a throttle valve, for keeping the pressure in said vaporizing chamber to be constant;
a copper liquid materials supply apparatus including:
   a canister filled with copper liquid materials,
   a pressurized gas inlet line connected to said canister for introducing a pressurized gas into said canister, and
   a copper liquid materials outlet line connected to said canister, and an orifice connected to a terminal end of said copper liquid materials outlet line, for supplying the copper liquid materials into said vaporizing chamber using the pressure from said pressurized gas inlet line;
a carrier gas supply apparatus including:
   a first mass flow controller (MFC) for controlling the mass flow of a carrier gas,
   a carrier gas outlet line having a first heating jacket, said carrier gas outlet line is connected to said first mass flow controller, a jet nozzle connected to a terminal end of said carrier gas outlet line, for generating ultra-micro liquid drops by jetting the copper liquid materials passed through said orifice, and an insulating block provided between said first heating jacket and said orifice for preventing a heat conduction, and a sealing device provided at said nozzle section for maintaining vacuum of said vaporizing chamber; and a jet system including:
a copper steam inlet line having a third heating jacket for keeping a copper steam vaporized at said vaporizing chamber, a second mass flow controller (MFC) for controlling the mass flow of said copper steam and said carrier gas both of which are introduced from said copper steam inlet line, and a copper steam outlet line connected to said second mass flow controller, and a copper steam jet connected to a terminal end of said copper steam outlet line, for jetting said copper steam into a reactive chamber.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
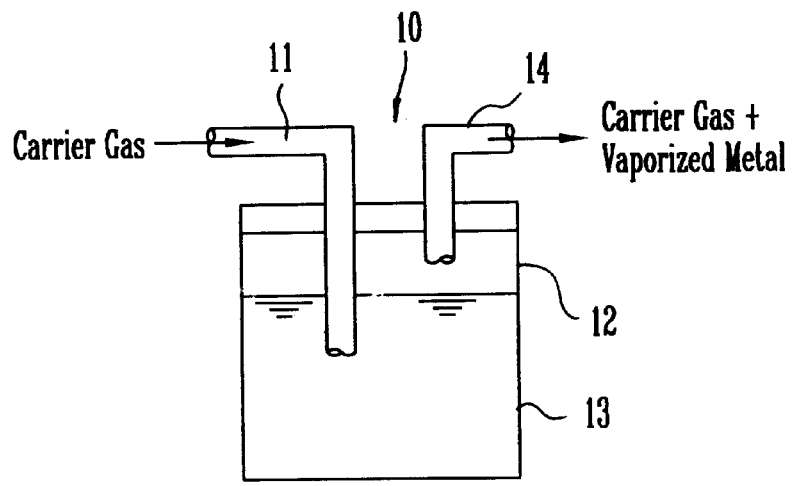
FIG. 1 is a schematic view of a conventional bubbler apparatus used in chemical vapor deposition method of a semiconductor device.
Figure 2:
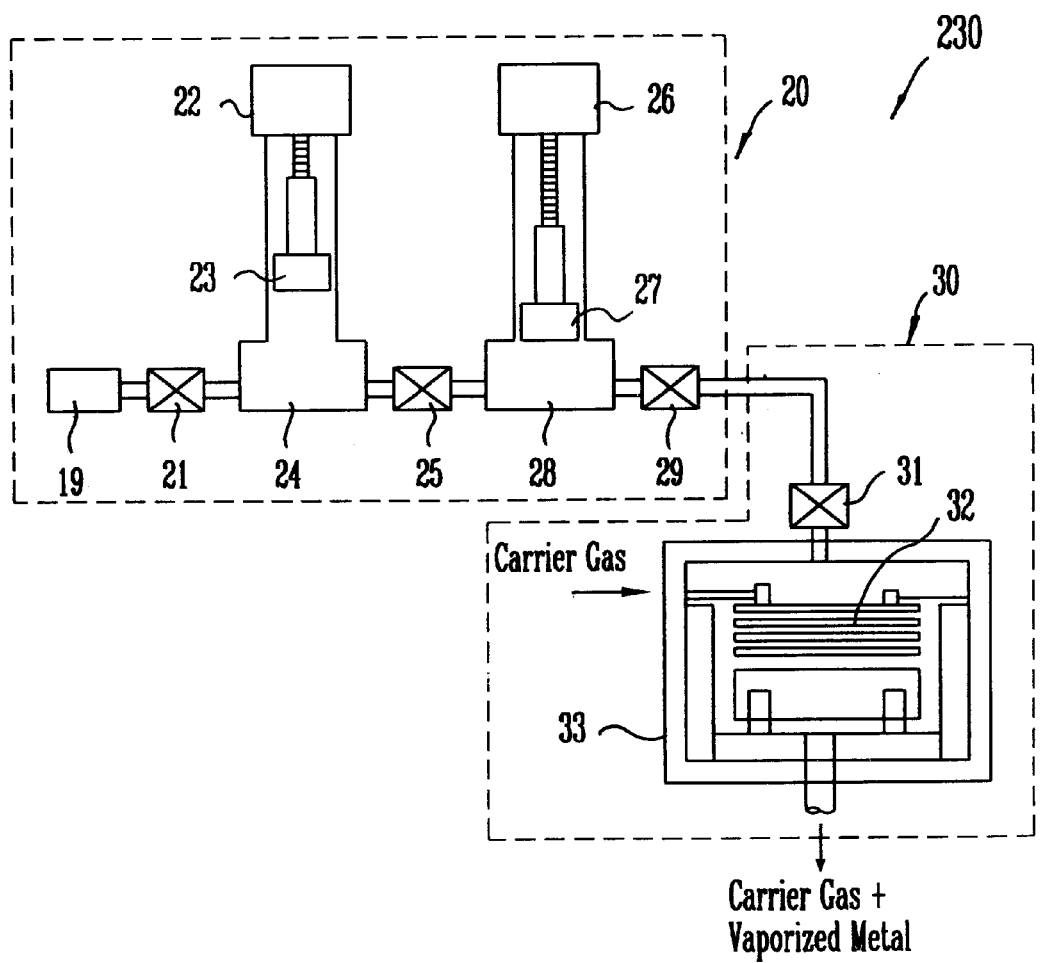
FIG. 2 is a schematic view of a conventional direct liquid injection (DLI) apparatus used in chemical vapor deposition method of a semiconductor device.

The present invention will be described in detail by way of a preferred embodiment with reference to accompanying drawings, in which like reference numerals are used to identify the same or similar parts.

Figure 3:
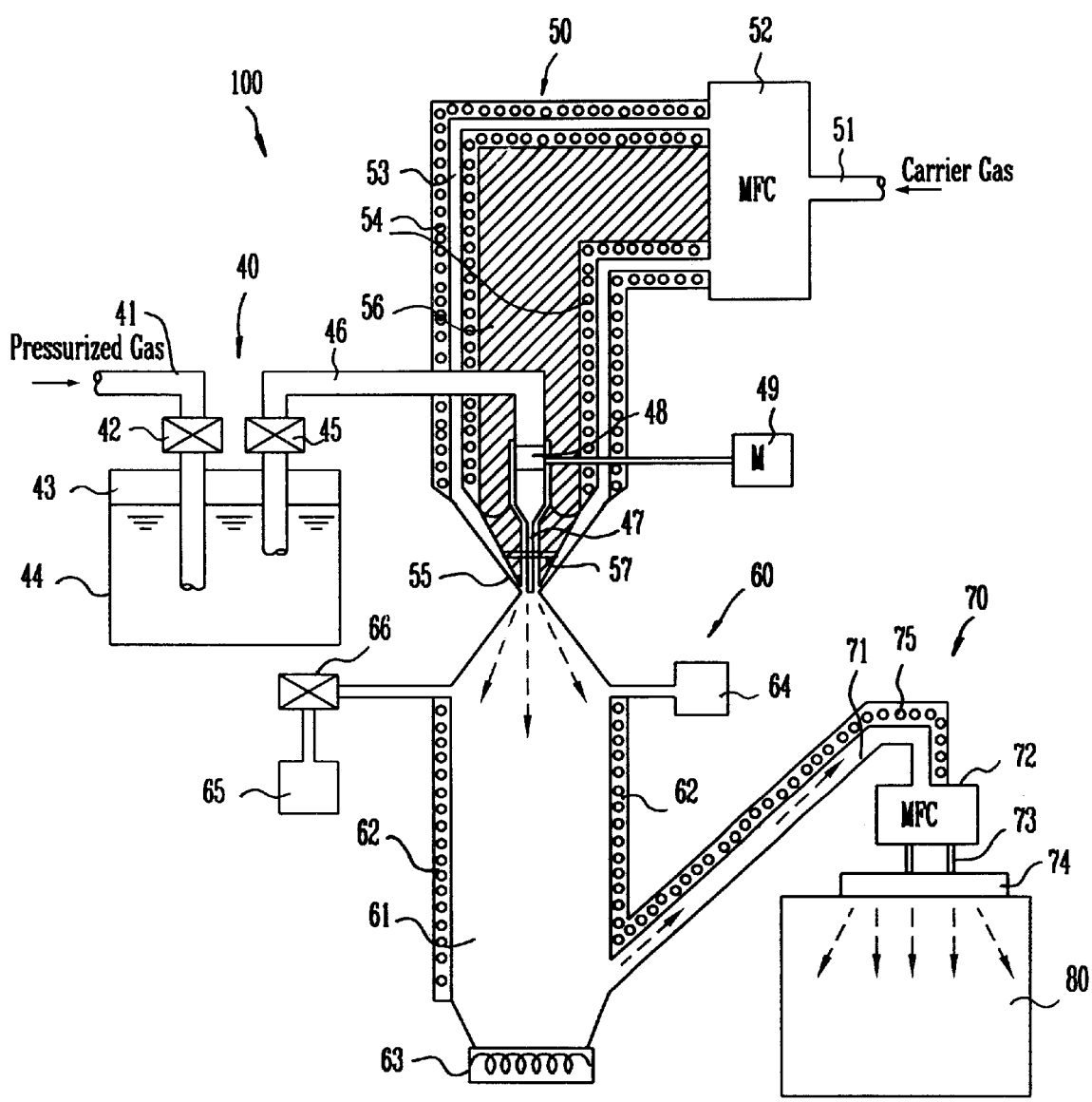
FIG. 3 is a schematic view of a liquid delivery system (LDS) used in chemical vapor deposition method of a semiconductor device according to the present invention.

FIG. 3 is a schematic view of a liquid delivery system (LDS) for depositing a copper layer using metal organic chemical vapor deposition method according to the present invention.

The liquid delivery system 100 according to the present invention includes a copper liquid materials supply apparatus 40, a carrier gas supply apparatus 50, a vaporizer 60 and a jet system 70.

The copper liquid materials supply apparatus 40 includes a pressurized gas inlet line 41 provided with a first valve 42 for introducing the pressurized gas into a canister 43 filled with copper liquid materials 44; and a copper liquid materials outlet line 46 provided with a second valve 45 for transferring the copper liquid materials 44 to an orifice 47 using the pressure from the inlet line 41.

Gases such as argon (Ar) or helium (He) may be used as the pressurized gas. At the top of the orifice 47 is provided a rotating device 48 rotated by the motor 49, which in turn rotates the orifice 47 upon driving of the system. At this time, the temperature of the supply apparatus 40 must be kept at a room temperature in all aspects.

The carrier gas supply apparatus 50 includes a first mass flow controller (MFC) 52 for controlling the mass flow of the carrier gas which was introduced from the carrier gas inlet line 51; a carrier gas outlet line 53 for transferring the carrier gas from the first MFC 52 to a jet nozzle 55 surrounded with a first heating jacket 54 for keeping the temperature at which the copper liquid materials 44 will be vaporized; an insulating block 56 for preventing the heat of the first heating jacket 54 between the orifice 47 and the carrier gas outlet line 53 from transferring to the orifice 47 section and for keeping the orifice 47 section always at a room temperature; and a sealing device 57 provided at the jet nozzle 55 section, for isolating the vacuum in the vaporizer 60 from the carrier gas outlet line 53.

The vaporizer 60 includes a vaporizing chamber 61 for vaporizing ultra-micro liquid drops of the copper liquid materials that are generated by jetting the copper liquid materials passed through the orifice 47, via the jet nozzle 55 of the outlet line 53; a second heating jacket 62 provided at the side of the vaporizing chamber 61, for keeping the interior of the vaporizing chamber 61 at the temperature at which copper will be vaporized; a heater 63 provided at the bottom of the vaporizing chamber 61, for vaporizing some ultra-micro liquid drops not vaporized via the vaporizing chamber 61; a pressure gauge 64 for keeping the interior of the vaporizing chamber 61 at a constant pressure; and a pressure pump 65 having a throttle valve 66.

The jet system 70 includes a copper steam inlet line 71 for transferring copper that is vaporized at the vaporizer 60, to a second MFC 72 along with the carrier gas, and a copper steam jet 74 for receiving the copper steam, the mass flow of which is controlled by the second MFC 72, from the copper steam outlet line 73, thereby to jet it to the reactive chamber 80. Around the copper steam inlet line 71 is provided a third heating jacket 75.

Next, the operation of the liquid delivery system 100 according to the present invention, which is configured to deposit a copper layer on a wafer through a metal organic chemical vapor deposition method using the copper liquid materials during the process of manufacturing a semiconductor device, will be explained below.

When the canister 43 containing the copper liquid materials 44 is pressurized at a pressure of about 10 psi to about 200 psi by means of argon (Ar) or helium (He) gas, the copper liquid materials therein will be raised to the copper liquid materials outlet line 46, while being pressurized by the pressurized gas inlet line 41. Then, they will be transferred to the orifice 47 that is rotated by the rotating device 48 at the rotating speed of about 10 rpm to about 1000 rpm. At this time, it is required that the copper liquid materials outlet line 46 must be kept at room temperature. Carrier gases such as argon (Ar), helium (He), hydrogen (H) etc. will pass through the carrier gas inlet line 51 to the first MFC 52, which in turn controls the mass flow of the gases to be in the range of about 20 sccm to about 1000 sccm. Then, the controlled carrier gases are transferred to the jet nozzle 55 of a cone type via the carrier gas outlet line 53. At this time, the carrier gas outlet line 53 keeps the copper liquid materials, via the first heating jacket 54, at the temperature in which they will be vaporized, thus always keeping the carrier gases jetted to the vaporizing chamber 61 at that temperature. These carrier gases are jetted into the vaporizing chamber 61 of a cyclone type at high pressure, along with the copper liquid materials passed from the jet nozzle 55 to the orifice 47. At this time, the rotating portion of orifice 47 is kept at room temperature by the insulating block 56. The jetted copper liquid materials will remain in the vaporizing chamber 61 as an ultra-micro drops (liquid +gas) state. However, as the second heating jacket 62 in the vaporizing chamber 61 keeps the temperature at which copper will be vaporized, most of the ultra-micro drops are vaporized via the vaporizing chamber 61. However, some ultra-micro drops which were not vaporized, will be vaporized by the heater 63 provided at the bottom of the vaporizing chamber 61. The pressure in the vaporizing chamber 61 is always monitored by the pressure gauge 64. Thus, the throttle valve 66 connected to the pressure pump 65 will keep the pressure in the vaporizing chamber 61 constant. Then, the copper steam that was vaporized by the second heating jacket 62 and the heater 63 will be sequentially transferred via the copper steam inlet line 71, the second MFC 72 and the copper steam outlet line 73 to the copper steam jet 74. The transferred copper steam will be jetted by the copper steam jet 74 to the reactive chamber 80 on which the wafer is mounted.

The copper steam inlet line 71 is provided with a third heating jacket 75 for keeping the temperature at which copper will be vaporized, so that the copper steam contained in the inlet line will not be liquidized again. Also, the inlet line 71 is installed upwardly at an angle of more than 30 degrees, preferably 40 to 70 degrees so that any incompletely vaporized copper byproducts do not flow into the reactive chamber 80. In addition, it is preferred that the copper steam outlet line 73 is short enough to enhance its conductance, with a length of about 5 to about 20 cm and a diameter of about ¼".

Upon completion of the deposition process, the vaporizing chamber 61 is kept at vacuum state by the pressure pump 65 and is then filled with atmosphere gas.

Meanwhile, the liquid delivery system 100 mentioned above may be applied to vaporize liquid materials difficult to be vaporized, such as aluminum (Al) widely used in the process of manufacturing a semiconductor device, tantalum (Ta), oxides like TEOS etc., materials like BST etc. as well as copper.

As can be understood from the above description with the present invention, the liquid delivery system can jet the carrier gas via the rotating orifice to the jet nozzle of a cone type, so that copper liquid materials can be formed in ultra-micro particles. Thus, the present invention can eliminate the phenomenon of clogging in a conventional vaporizer, can implement a high reproduction and thus can enhance a deposition speed, compared to conventional liquid delivery apparatus (bubbler and DLI apparatus). Accordingly, it has outstanding advantages in that it makes a copper film using chemical vapor deposition method applicable to a semiconductor device and also facilitates the management and cleaning of the equipment due to a simplified vaporizing apparatus.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed are:

1. A liquid delivery system, comprising:
 a copper liquid materials supply means for supplying copper liquid materials at room temperature to a vaporizer means via an orifice which is rotating at a constant speed;
 a carrier gas supply means for jetting a carrier gas kept at a temperature at which copper will be vaporized via a jet nozzle, the carrier gas causing the copper liquid materials to be supplied to said vaporizer means via said orifice in micro drops; the copper liquid materials and carrier gas mixing to form a vaporized copper steam in the vaporizer;
 a jet means for jetting the vaporized copper steam into a reactive chamber, the jet means including a copper steam inlet line having a heating jacket for maintaining a temperature of the vaporized copper steam, a mass flow controller for controlling a mass flow of said vaporized copper steam introduced from the copper steam inlet line, and a copper steam outlet line for transferring the vaporized copper steam from the mass flow controller to a copper steam jet whereby the vaporized copper steam is introduced into the reactive chamber, wherein
 the copper steam inlet line extends from the vaporizer means at an upward angle of about 40° to about 70° so that incompletely vaporized copper byproducts cannot be supplied to said reactive chamber.

2. A liquid delivery system, comprising:
 a vaporizer including:
  a vaporizing chamber having a first heating jacket provided at a side wall thereof, the vaporizing chamber for vaporizing ultra-micro liquid drops of a copper liquid materials,
  a heater provided at a bottom of said vaporizing chamber, the heater also for vaporizing ultra-micro liquid drops, and
  a pressure gauge and a pressure pump having a throttle valve, for keeping the pressure in said vaporizing chamber constant;
 a copper liquid materials supply apparatus including:
  a canister filled with copper liquid materials,
  a pressurized gas inlet line connected to said canister for introducing a pressurized gas into said canister, and
  a copper liquid materials outlet line connected to said canister, and an orifice connected to a terminal end of said copper liquid materials outlet line, for supplying the copper liquid materials into said vaporizing chamber using the pressure from said pressurized gas inlet line;
 a carrier gas supply apparatus including:
  a first mass flow controller (MFC) for controlling a mass flow of a carrier gas,
  a carrier gas outlet line having a second heating jacket, said carrier gas outlet line is connected to said first mass flow controller,
  a jet nozzle connected to a terminal end of said carrier gas outlet line, for generating ultra-micro liquid drops by jetting the copper liquid materials passed through said orifice, and
  an insulating block provided between said second heating Jacket and said orifice for preventing a heat conduction; and
 a jet system including:
  a copper steam inlet line having a third heating jacket for keeping a copper steam vaporized at said vaporizing chamber,
  a second mass flow controller (MFC) for controlling the mass flow of said copper steam and said carrier gas both of which are introduced from said copper steam inlet line, and a copper steam outlet line connected to said second mass flow controller, and a copper steam jet connected to a terminal end of said copper steam outlet line, for jetting said copper steam into a reactive chamber, wherein said orifice has a rotating device which is rotated by a motor, and is rotated at a rotating speed of about 10 rpm to about 1000 rpm.

3. The liquid delivery system according to claim 2, wherein said pressurized gas is argon (Ar) or helium (He) and is pressurized to a pressure of about 10 psi to about 200 psi.

4. The liquid delivery system according to claim 2, wherein said carrier gas is one from a group consisting of argon, helium and hydrogen.

5. The liquid delivery system according to claim 2, wherein said copper steam outlet line is about 5 cm to about 20 cm in length and about ¼" in diameter.

6. A liquid delivery system, comprising:
a vaporizer including:
a vaporizing chamber having a first heating jacket provided at a side wall thereof, the vaporizing chamber for vaporizing ultra-micro liquid drops of a copper liquid materials,
a heater provided at a bottom of said vaporizing chamber, the heater also for vaporizing ultra-micro liquid drops, and
a pressure gauge and a pressure pump having a throttle valve, for keeping the pressure in said vaporizing chamber constant;
a copper liquid materials supply apparatus including:
a canister filled with copper liquid materials,
a pressurized gas inlet line connected to said canister for introducing a pressurized gas into said canister, and
a copper liquid materials outlet line connected to said canister, and an orifice connected to a terminal end of said copper liquid materials outlet line, for supplying the copper liquid materials into said vaporizing chamber using the pressure from said pressurized gas inlet line;
a carrier gas supply apparatus including:
a first mass flow controller (MFC) for controlling a mass flow of a carrier gas,
a carrier gas outlet line having a second heating jacket, said carrier gas outlet line is connected to said first mass flow controller,
a jet nozzle connected to a terminal end of said carrier gas outlet line, for generating ultra-micro liquid drops by jetting the copper liquid materials passed through said orifice, and
an insulating block provided between said second heating jacket and said orifice for preventing a heat conduction; and
a jet system including:
a copper steam inlet line having a third heating jacket for keeping a copper steam vaporized at said vaporizing chamber,
a second mass flow controller (MFC) for controlling the mass flow of said copper steam and said carrier gas both of which are introduced from said copper steam inlet line, and
a copper steam outlet line connected to said second mass flow controller, and a copper steam jet connected to a terminal end of said copper steam outlet line, for jetting said copper steam into a reactive chamber, wherein the copper steam inlet line extends at an upward angle of about 40° to 70°, relative to the vaporizer, to help prevent incompletely vaporized copper byproducts from being supplied to said reactive chamber.

7. The liquid delivery system according to claim 6, wherein said pressurized gas is argon (Ar) or helium (He) and is pressurized to a pressure of about 10 psi to about 200 psi.

8. The liquid delivery system according to claim 6, wherein said carrier gas is one from a group consisting of argon, helium and hydrogen.

9. The liquid delivery system according to claim 6, wherein said copper steam outlet line is about 5 cm to about 20 cm in length and about ¼" in diameter.

10. A liquid delivery system comprising:
a vaporizer including a vaporizing chamber having an opening at a top portion thereof for the introduction of liquid materials and a carrier gas, a heating jacket surrounding a side wall of the vaporizing chamber, and a heater formed at a bottom portion of the vaporizing chamber opposite to said opening, the heater being separate from the heating jacket;
a liquid materials supply means having a materials outlet line terminating in an orifice which exits into the opening of the vaporizing chamber, the materials outlet line being provided with a motor-driven rotating means approximate to said orifice;
a carrier gas supply means comprising a mass flow controller configured to control the flow of carrier gas introduced there into, a carrier gas outlet line provided with a heating jacket configured to maintain a temperature of a carrier gas introduced into the mass flow controller, the carrier gas outlet line terminating in a jet nozzle approximate to the orifice of the liquid materials outlet line; and
a jet means configured to deliver contents of the vaporizing chamber to a reactive chamber, the jet means comprising a steam inlet line connected at a first end to the vaporizer chamber and at a second end to a mass flow controller, a portion of the copper steam inlet line extending at an upward angle from its first end; and
a copper steam jet positioned between the mass flow controller and the reactive chamber so as to deliver contents of the vaporizing chamber into the reactive chamber during a chemical vapor deposition process.

11. The liquid delivery system according to claim 10, further comprising a heating jacket provided along an angled portion of the steam inlet line.

12. The liquid delivery system according to claim 10, further comprising a pump operatively connected to the vaporizing chamber to maintain a constant pressure therein.

* * * * *